United States Patent
Yeom et al.

(10) Patent No.: US 6,218,272 B1
(45) Date of Patent: Apr. 17, 2001

(54) METHOD FOR FABRICATING CONDUCTIVE PAD

(75) Inventors: Kye-Hee Yeom, Suwon; Kyu-Pil Lee, Kyunggi-do, both of (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 09/307,659

(22) Filed: May 10, 1999

(30) Foreign Application Priority Data

May 12, 1998 (KR) ................................................ 98-17035

(51) Int. Cl.[7] ................... H01L 21/3205; H01L 21/4763
(52) U.S. Cl. ............................ 438/586; 438/587; 257/385
(58) Field of Search .................... 438/586, 429, 438/585, 587; 257/368, 377, 382, 385, 390

(56) References Cited

U.S. PATENT DOCUMENTS

| | | | |
|---|---|---|---|
| 4,604,641 | * 8/1986 | Konishi | 357/59 |
| 4,686,000 | * 8/1987 | Heath | 156/643 |
| 4,696,097 | * 9/1987 | McLaughlin et al. | 438/429 |
| 4,728,624 | * 3/1988 | Silvestri et al. | 438/322 |
| 4,801,988 | * 1/1989 | Kenney | 357/23.6 |
| 5,112,772 | * 5/1992 | Wilson et al. | 438/426 |
| 5,134,085 | * 7/1992 | Gilgen et al. | 438/210 |
| 5,262,663 | * 11/1993 | Rho et al. | 257/308 |
| 5,362,666 | * 11/1994 | Dennison | 438/396 |
| 5,389,559 | * 2/1995 | Hsieh et al. | 438/243 |
| 5,545,926 | * 8/1996 | Kohyama et al. | 257/755 |
| 5,670,404 | * 9/1997 | Dai | 438/239 |
| 5,700,349 | * 12/1997 | Tsukamoto et al. | 156/657.1 |
| 5,854,135 | * 12/1998 | Ko | 438/712 |
| 5,863,820 | * 1/1999 | Huang | 438/241 |
| 5,866,449 | * 2/1999 | Liaw et al. | 438/238 |
| 5,879,956 | * 3/1999 | Seon et al. | 438/3 |
| 5,879,986 | * 3/1999 | Sung | 438/253 |
| 5,899,722 | * 5/1999 | Huang | 438/305 |
| 5,965,922 | * 10/1999 | Matsui | 257/369 |
| 5,998,249 | * 12/1999 | Liaw et al. | 438/238 |
| 6,001,717 | * 12/1999 | Lien | 438/586 |

OTHER PUBLICATIONS

240nm Pitch 4GDRAM Array MOSFET Technologies with X–ray Lithography, IEDM, 1996, pp. 601–603.
A Process Technology for 1 Giga–Bit DRAM, IEDM, 1995, pp. 907–909.
A New Planar Stacked Technology (PST) for Scaled and Embedded DRAMs, IEDM, 1996, pp. 597–599.
A $0.23 \mu m^2$ Double Self–Aligned Contact Cell for Gigabit DRAMs With a Ge–Added Vertical Epitaxial Si Pad, IEDM, 1996, pp. 589–592.
A Fully Printable, Self–aligned and Planarized Stacked Capacitor DRAM Cell Technology For 1Gbit DRAM and Beyond, Symposium on VLSI Technology Digest of Technical Papers, Jan. 1997, pp. 17–18.

* cited by examiner

Primary Examiner—Olik Chaudhuri
Assistant Examiner—Ginette Peralta
(74) Attorney, Agent, or Firm—Cantor Colburn LLP

(57) ABSTRACT

According to the present invention, a conductive pad for a self-aligned direct contact and a self-aligned buried contact is formed of a first pad and a second pad, in twice, wherein the self-aligned direct contact and the self-aligned buried contact connect respectively a bit line/storage electrode to a semiconductor substrate. The first pad and the second pad are formed by combining a reverse active type self-aligned contact (RAT-SAC), a contact type self-aligned contact (CT-SAC), and an epitaxial growth processes. Thus, it is prevented that a shoulder portion of a gate electrode is overetched to create electrical short of pad to gate, a size of a pad is limited to a spacing between gate electrodes, a pad and a semiconductor substrate are not electrically connected each other (not-open), and electrical connection is created by lack of margin between BCs, in case of using only one process selected from a group consisting of the RAT-SAC process, the CT-SAC process, and the epitaxial growth processes.

17 Claims, 9 Drawing Sheets

METHOD FOR FABRICATING CONDUCTIVE PAD

FIELD OF THE INVENTION

The present invention relates to a method for fabricating a semiconductor device, and more particularly to a method for fabricating a conductive pad for a bit line/storage electrode of a DRAM (dynamic random access memory) device.

BACKGROUND OF THE INVENTION

Over the years, the development fabrication of fine and high integrated semiconductor devices has been actively pursued. Even more recently, a VLSI (very large scale integration) semiconductor device, such as giga-bit DRAM (dynamic random access memory) designed according to a 256 mega-bit design rule or under a 0.25 $\mu$m size rule, is being developed and fabricated. As high integration of semiconductor devices is performed, it becomes more increasingly desired to enhance mask aligned margin of a lithography process which is essential to formation of a semiconductor components structure.

When a semiconductor device is normally fabricated, patterns which are formed of various materials such as a metal layer, a semiconductor layer, and an insulating layer gradually become thin on a semiconductor substrate, thereby forming a fine semiconductor components structure. When these patterns for semiconductor components become thin, it is required that a mask be aligned to a pattern in a lower layer formed during a former process and then, an upper layer pattern be formed during a lithography process. However, misalignment between an upper layer and an lower layer pattern may occur during the lithography process. Accordingly, it is required to leave room preventing misalignment in a pattern spacing, so as to set up a margin therein. But the margin may be in the way of high integration of the pattern.

The technical methods obtaining a margin-less structure are examined from many sources. In these technical methods, it is important to obtain a margin-less structure especially while forming a contact hole. Since the contact hole is formed on a semiconductor substrate and many layers of a semiconductor layer and a metal layer, the formation of a margin-less contact hole is the most effective to achieve high density/high integration of a semiconductor device. The effective methods among techniques for fabricating a margin-less contact hole include a method for forming a self-aligned contact hole. In addition, other various and reliable methods have also been investigated. These methods for forming a self-aligned contact hole include a reverse active type self-aligned contact (referring to below as RAT-SAC) process and a contact type self-aligned contact (referring to below as CT-SAC) process.

A typical technology of the former process is published in an article entitled "240 nm Pitch 4GDRAM Array MOSFET Technologies with X-ray Lithography" in IEDM 96 and "A Fully Printable, Self-aligned and Planarized Stacked Capacitor DRAM Cell Technology for 1 Gbit DRAM and Beyond" in Symposium on VLSI Technology Digest of Technical Papers, 1997. On the other hand, a typical technology of the latter process is published in an article entitled "A Process Technology for 1 Giga-Bit DRAM" in IEDM 95 and "A New Planar Stacked Technology (PST) for scaled and Embedded DRAMs" in IEDM 96.

FIG. 1A illustrates a cell array layout of a DRAM device having a contact hole (for example, a storage electrode and contact holes for a bit line pad) which is formed by using the RAT-SAC process. A gate electrode (or word line) 10, a self-aligned buried contact 12 (hereinafter referred to as BC) connecting a storage electrode to a semiconductor substrate, a self-aligned direct contact 14 (hereinafter referred to as DC) connecting a bit line to a semiconductor substrate are illustrated in FIG. 1A. An active region where a device is formed is formed of a T-shaped structure, as shown by the dotted line of FIG. 1A.

FIG. 1B illustrates a cross-sectional view taken along a line 1–1' of FIG. 1A. If a photo etching process for forming a contact hole is performed by the RAT-SAC process, as shown in FIG. 1B, an opening forming a bit line and pads for a storage electrode is formed according to a shape of an active region wherein two switching transistors comprising a memory cell are formed. Thus, a relatively wider opening region may be obtained using this process in comparison with the latter process, hereinafter described. In the RAT-SAC process, an electrical short of gate to pad may be prevented. The short results from the etching of a gate shoulder portion (a shoulder portion of an upper layer of a gate electrode serving as an etch-stop layer). However, because etching a nitride layer, which serves as a capping layer, the height (referring to below as step) between a gate electrode 10 and a nitride layer 17 maybe reduced to a part marked by a dotted line. At this time, the capping layer may protect a gate electrode while performing an etching process when an opening is formed.

As a result, it is difficult to secure an original purpose (to secure misalignment margin), as illustrated in FIG. 1B. That is, in the SAC process using an etch selectivity, it is ideal that a conductive layer (for example, a doped polysilicon) for a pad 18 should be filled to a dotted line 20 shown in FIG. 1B. However, in the substantial RAT-SAC process, a conductive layer is filled to a dotted line 22 shown in FIG. 1B (a pad of a surface should be formed under an insulating layer 17 surrounding a gate electrode 10 so as to prevent short of pad to pad). A size of a finally formed pad 18 may be formed less than a desirable size 20. Limited to a spacing between one gate and another gate, a size of a pad is reduced in proportion to integration of a semiconductor memory device, in FIG. 1A. Consequently, it is difficult to obtain the aforesaid margin-less structure (to achieve the original purpose of a self-aligned contact). Further, as mentioned above, an upper surface of the pad is formed between gate electrodes, so that the size thereof is reduced and the process margin (that is, misalignment margin) is rapidly reduced when a contact hole for connecting a storage electrode or a bit line to a semiconductor substrate is formed. As a result, when a device is substantially operated, soft refresh fail occurs.

FIG. 2A illustrates a cell array of a DRAM device having a contact hole (for example, a contact hole for a storage electrode and a bit line) formed by using the CT-SAC process. The same reference numerals in FIG. 2B denote the same elements in FIG. 1A. In case a contact hole is formed by using the CT-SAC process, as shown in FIG. 2A, the BC 12 is formed to be relatively less than the DC 14. FIG. 2B illustrates a cross-sectional view taken along a line 2–2' of FIG. 2A.

If a contact hole is formed using the CT-SAC process, a process resultant is obtained, as shown in FIG. 2B. According to the CT-SAC process, contact holes for the BC/DC are formed of a circle-shape or an ellipse-shape. After formation of a photoresist pattern, an etching process is performed to form the contact hole. An opening region corresponding to an active region is secured, in the RAT-SAC process. On the other hand, an opening region is small with a circle-shape or an ellipse-type, in the CT-SAC, as shown in FIG. 2A. Since an etch selectivity of the RAT-SAC process is relatively lower than that of CT-SAC process (at this time, a not-open may occur), etching time should be increased to overcome the lower etch selectivity. As a result, a shoulder portion of a gate electrode 10 is overetched to create an exposure thereof (to create electrical short of pad to gate electrode).

In addition, as described in FIG. 2A, since the BC 12 is formed less than the DC 14, a gate shoulder portion related with the DC 14 should be relatively more etched than a gate shoulder portion related with the BC 12 so as to form a contact hole having an equal depth.

Consequently, an etch selectivity of a nitride layer with respect to an interlayer insulating film is not secured to expose a gate electrode, as mentioned above.

A technique solving fundamentally the matters of the aforesaid SAC processes is published in an article entitled "A 0.23 μm Double Self-Aligned Contact Cell for Gigabit DRAMs with A Ge-Added Vertical Epitaxial Si Pad" in IEDM 96. The following is a summary description of the invention set forth in the article. While performing an etching process to form a gate spacer for an LDD (lightly doped drain) instead of a self-aligned contact, source/drain regions of a switching transistor are simultaneously formed to restrain exposure of a gate electrode (shoulder portion). Accordingly, this invention provides an excellent device in terms of electric short of pad to gate. In view of word line direction, however, if a ratio of height direction growth speed (longitudinal growth rate) to width direction growth speed (lateral growth rate) is not high, it is quite probable that electrical short of pad to pad will occur along a groove between gate electrodes, that is, word lines. Therefore, a pad cannot grow at random.

SUMMARY OF THE INVENTION

It is therefore an object of the invention to provide a method for forming a conductive pad being suitable for a very large scale integration (VLSI) semiconductor device.

It is another object of the invention to provide a method for forming a conductive pad preventing fundamentally electrical short of gate to pad, generated when a self-aligned contact hole is formed.

It is a further object of the invention to provide a method for forming a conductive pad preventing fundamentally a conductive pad filling a self-aligned contact hole from getting small, when the self-aligned contact hole is formed.

It is yet another object of the invention to provide a method for forming a conductive pad securing process margin between buried contacts, when a self-aligned buried contact hole is formed.

According to an object of this invention, the method includes providing a semiconductor substrate wherein a plurality of wires are formed, the plurality of wires being surrounded by a first insulating layer, forming a first conductive layer covering the first insulating layer and the semiconductor substrate, etching the first conductive layer to expose the first insulating layer and to remain only between the wires, thereby forming a first pad, forming sequentially second and third insulating layers covering the first pad and the first insulating layer, forming a photoresist pattern for exposing the first pad on the third insulating layer over a surface of the wires, etching sequentially the third and the second insulating layers by using the photoresist pattern as a mask until the first pad is exposed, forming a second conductive layer covering the first pad and the third insulating layer after removal of the photoresist pattern, and etching the second conductive layer until the second insulating layer is exposed, thereby forming a second pad.

In a preferred embodiment of the present invention, the first and second pads serve as a pad for a bit line/storage electrode of DRAM (dynamic random access memory).

In a preferred embodiment of the present invention, the first conductive layer is made of polysilicon having a thickness of about 3,000 to 7,000 Å. The polysilicon is then doped with the same impurity as source/drain of an integrated circuit comprising a DRAM cell.

In a preferred embodiment of the present invention, the second insulating layer serves as an etch-stop layer during the etching of the third insulating layer.

According to another object of this invention, the method includes providing a semiconductor substrate wherein a plurality of wires are formed, the plurality of wires being surrounded by a first insulating layer, forming a first conductive pad between the wires by using a selective epitaxial growth process, forming a second insulating layer on an overall surface of the semiconductor substrate, etching the second insulating layer until the first conductive pad is exposed, forming sequentially a third and a fourth insulating layers on the overall surface of the semiconductor substrate, forming a photoresist pattern for exposing the first conductive pad on the fourth insulating layer over a surface of the wires, etching sequentially the fourth and the third insulating layers by using the photoresist pattern as a mask until the first conductive pad is exposed, forming a conductive layer covering the first conductive pad and the fourth insulating layer; and etching the conductive layer until the fourth insulating layer is exposed, thereby forming a second conductive pad.

According to yet a further object of this invention, the method includes providing a semiconductor substrate wherein a plurality of wires are formed, the plurality of wires being surrounded by an insulating layer, forming a conductive layer covering the insulating layer and the semiconductor substrate, etching the conductive layer to expose the insulating layer and to remain only between the wires, and forming a second pad on the first pad by using an epitaxial growth process, so that a surface of the wires is not covered.

According to yet another object of this invention, the method includes providing a semiconductor substrate wherein a plurality of wires are formed, the plurality of wires being surrounded by a first insulating layer, forming a first conductive pad only between the wires by using a first epitaxial growth process, forming a second insulating layer on an overall surface of the semiconductor substrate, etching the second insulating layer until the first conductive pad is exposed, forming a second conductive pad on the first conductive pad by using a second epitaxial growth process, so that a surface of the wires is not covered, etching the third insulating layer until the second conductive pad is exposed, after formation of a third insulating layer on an overall surface of the semiconductor substrate.

Thus, a conductive pad connecting bit line/storage electrode to a semiconductor substrate is formed by the first and second pad processes.

According to the novel method of this invention, a conductive pad for a self-aligned direct contact (hereinafter referred to as DC) and a self-aligned buried contact (hereinafter referred to as BC) are formed of first and second pads, in twice. The DC and the BC connect the bit line/storage electrode to the semiconductor substrate. The first and the second pads are formed by combining a reverse active type self-aligned contact (hereinafter referred to as RAT-SAC), a contact type self-aligned contact (hereinafter referred to as CT-SAC), and an epitaxial growth processes. Thus, the present invention prevents a shoulder portion of a gate electrode from being overetched hereby creating an electrical short of pad to gate. To accomplish this, the size of a pad is limited to a spacing between gate electrodes, and the pad and the semiconductor substrate are not electrically connected to each other (not-open). The electrical connection is created by a lack of margin between BCs, in case of using only one process selected from a group consisting of the RAT-SAC process, the CT-SAC process, and the epitaxial growth processes.

BRIEF DESCRIPTION OF THE DRAWINGS

The above objects and advantages of the present invention will become more apparent by describing in detail a preferred embodiment thereof with reference to the attached drawings.

DETAILED DESCRIPTION OF THE PREFERRED EMBODIMENTS

Figure 1A:
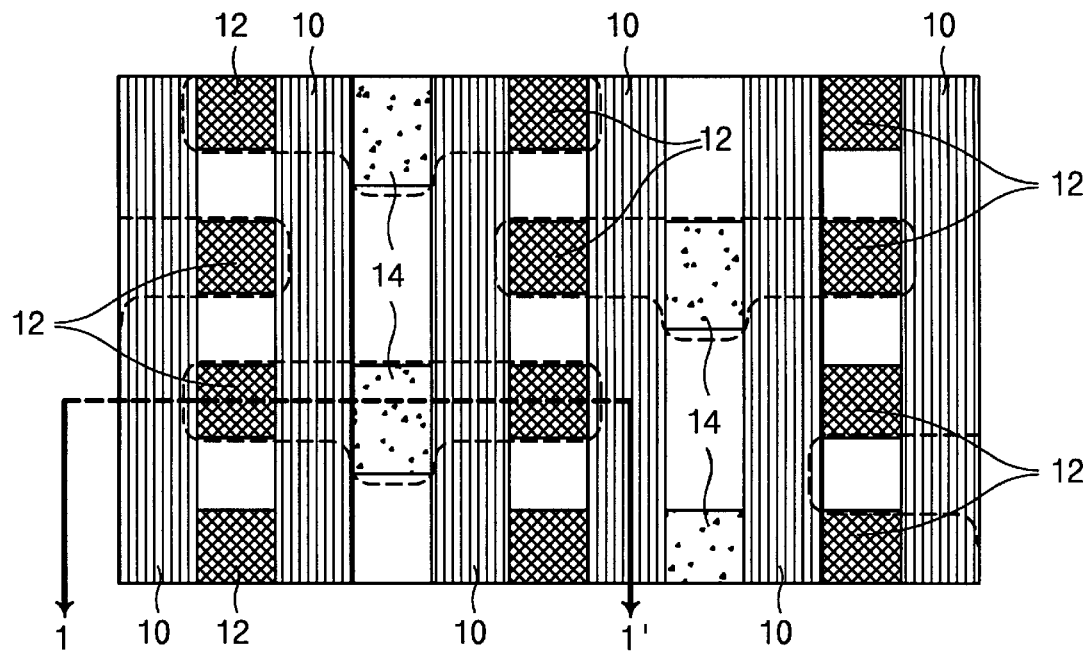
FIG. 1A is a plan view showing a cell array layout of a DRAM (dynamic random access memory) device having a self-aligned contact hole formed by using a reverse active type self-aligned contact process.
Figure 1B:
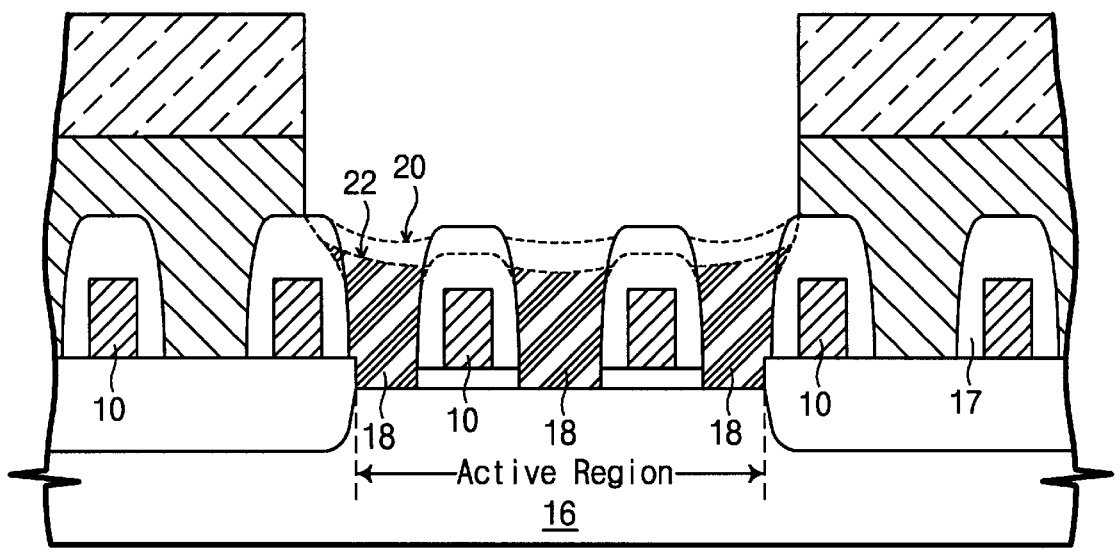
FIG. 1B is a sectional view taken along a line 1–1' of FIG. 1A.
Figure 2A:
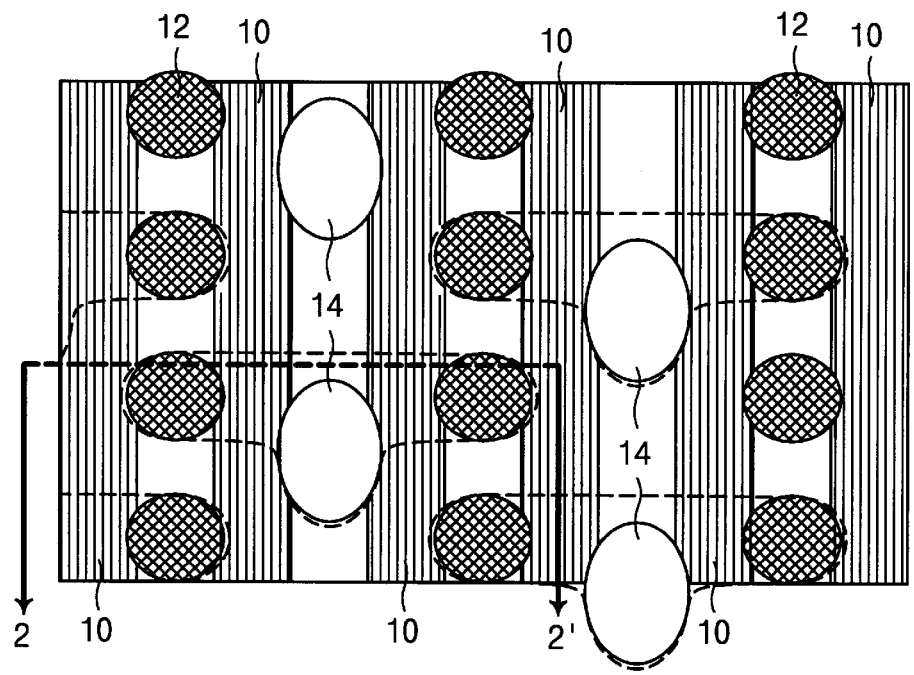
FIG. 2A is a plan view showing a cell array of a DRAM device having a self-aligned contact hole formed by using a contact type self-aligned contact process.
Figure 2B:
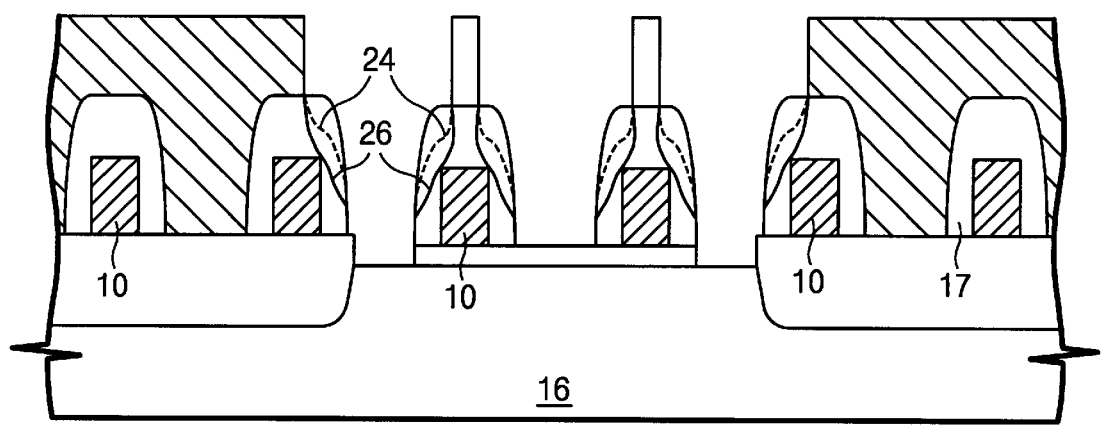
FIG. 2B is a sectional view taken along a line 2–2' of FIG. 2A.

The invention may be understood and its objects will become apparent to those skilled in the art by reference to the accompanying drawings as follows:

FIG. 3A to FIG. 3G illustrate a process of forming a pad for a bit line/storage electrode according to a first embodiment of this invention.

First, an isolating insulator layer 102 is formed on a semiconductor substrate 100. An active region having switching transistors formed therein is defined by the isolating insulator layer 102. The switching transistors comprise a memory cell of a DRAM device (dynamic random access memory). Conventionally, a first insulating layer 104, a first conductive layer 106, and a second insulating layer 108 are sequentially formed on the semiconductor substrate 100. The first insulating layer 104 serves afterwards as a gate oxide layer. The second insulating layer 108 is made of nitride having a thickness of about 1,000 to 2,000 Å. After performing a conventional photo-etching process to form a gate electrode, an ion implantation process is performed to form a source/drain region.

Figure 3A:
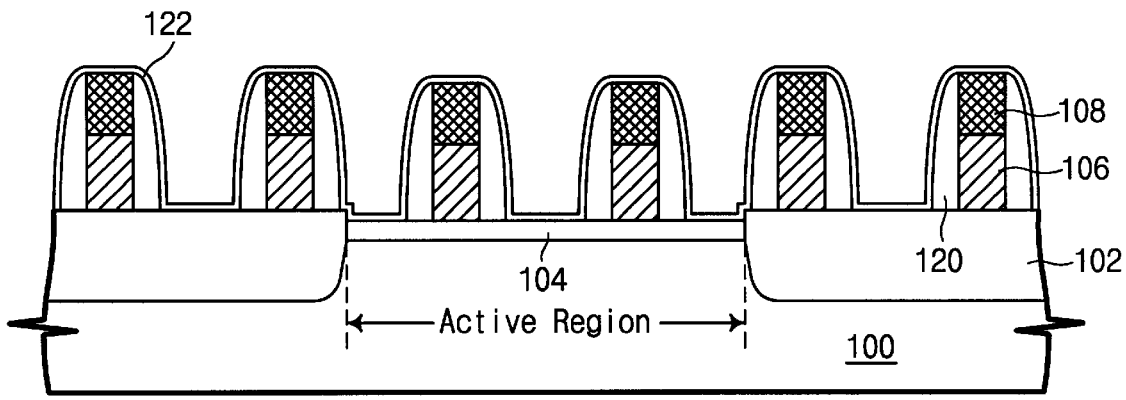
FIG. 3A to FIG. 3G are sectional views describing a method for forming a pad according to the First Embodiment of the present invention.

A third insulating layer is then formed on an overall surface of the semiconductor substrate. The third insulating layer is entirely etched by a conventional anisotropic reactive ion etching (hereinafter referred to as etch back), so that a gate spacer 120 is formed on sidewalls of the gate electrode 106 and the second insulating layer 108, as shown in FIG. 3A. A fourth insulating layer 122 is formed on the overall surface of the semiconductor substrate 100. The fourth insulating layer 122 is made of nitride having a thickness of about 50 to 200 Å.

Figure 3B:
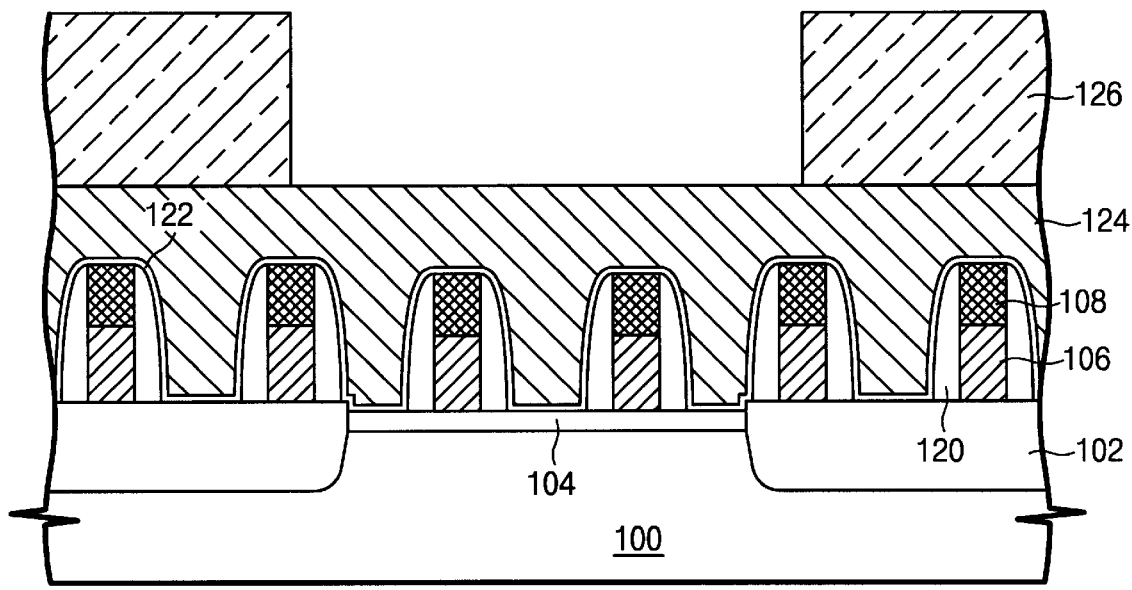

A fifth insulating layer 124 which acts as an interlayer insulating film, is formed on the overall surface of the semiconductor substrate. The fifth insulating layer 124 is made of oxide having a thickness of about 3,000 to 9,000 Å. After planarization-etch of the fifth insulating layer 124 by using a CMP (chemical mechanical polishing) process or the etch back process, a photoresist pattern 126 is formed to open the only active region. A resultant according to a series of aforesaid processes is shown in FIG. 3B.

If the fourth insulating layer 122 is etched and the photoresist pattern 126 is removed after selectively etching the fifth insulating layer 124 with respect to the second, the third, and fourth insulating layers 108, 120, and 122, respectively, by using the photoresist pattern 126 as a mask, a reverse active type self-aligned contact(hereinafter referred to as RAT-SAC) structure is obtained. That is, the fifth insulating layer 124 serving as an interlayer insulating film is only left on the isolating insulator layer 102, and not left on the active region.

Figure 3C:
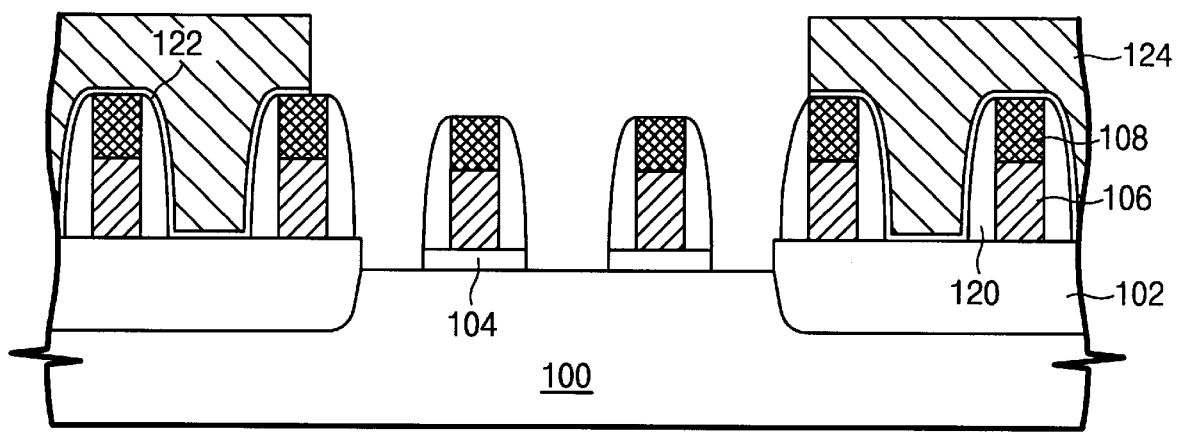
Figure 3D:
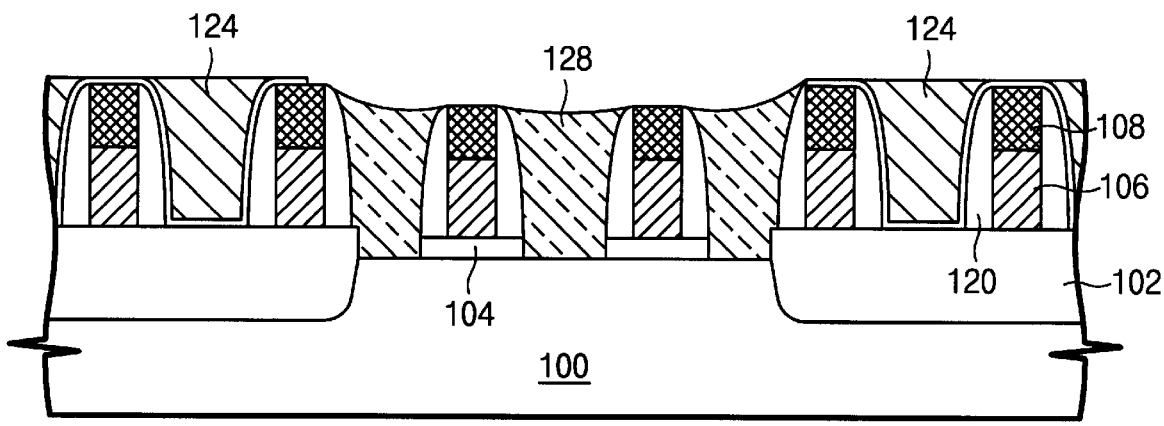

A second conductive layer is formed on the process resultant of FIG. 3C, that is, the overall surface of the semiconductor substrate 100. The second conductive layer is made of doped polysilicon with a thickness of about 3,000 to 7,000 Å. The second conductive layer and the fifth insulating layer 124 are etched by the CMP process or the etch back process. As shown in FIG. 3D, a first pad 128, as a resultant of this process, is formed only between an insulating layer (comprising insulating layers 104, 108, and 120) surrounding the gate electrode 106.

Figure 3E:
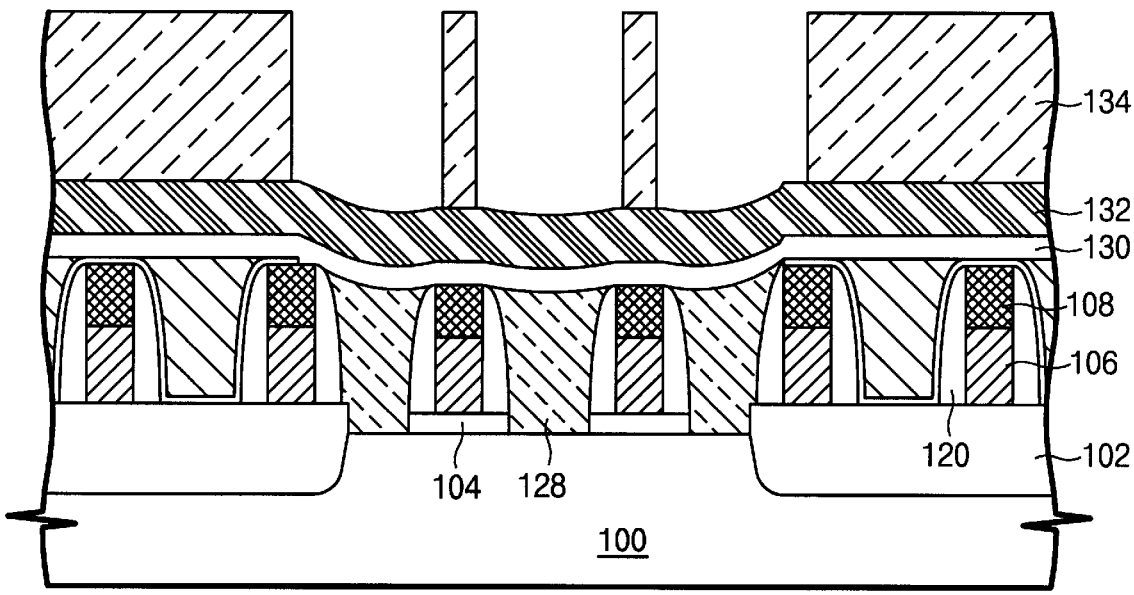

A sixth insulating layer 130 and a seventh insulating layer 132 are sequentially formed on the overall surface of the semiconductor substrate 100 having the first pad 128. Subsequently, a photoresist pattern 134 is formed to perform a contact type self-aligned contact (hereinafter referred to as CT-SAC) process, as shown in FIG. 3E. That is, a photoresist is removed on a region where a contact is formed, while being left on a region where an interlayer insulating film is formed.

Figure 3F:
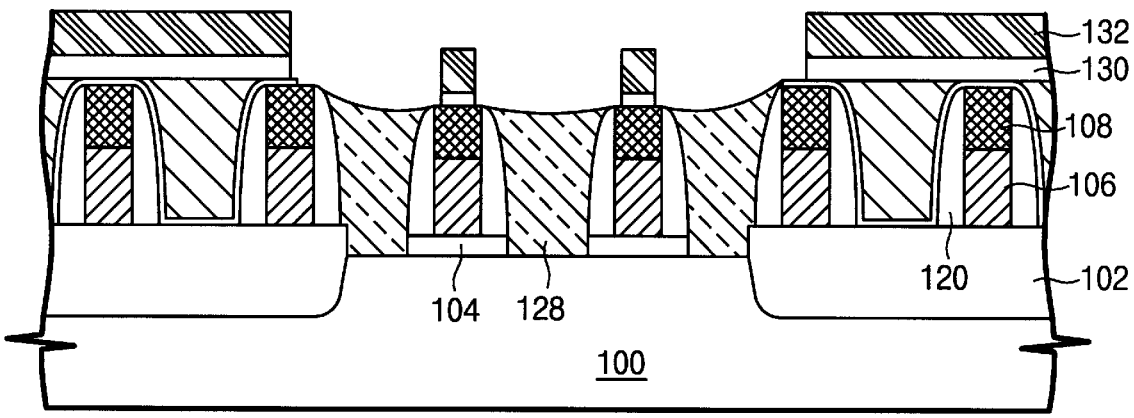

The sixth insulating layer 130 and the seventh insulating layer 132 are sequentially etched by using the photoresist pattern as a mask until a surface of the first conductive pad is exposed. An etching resultant is shown in FIG. 3F, then. The sixth insulating layer 130 serves as an etch-stop layer during etching of the seventh insulating layer 132. The sixth insulating layer 130 is made of nitride having a thickness of about 50 to 200 Å and the seventh insulating layer 132 is made of oxide having a thickness of about 500 to 2,000 Å.

Figure 3G:
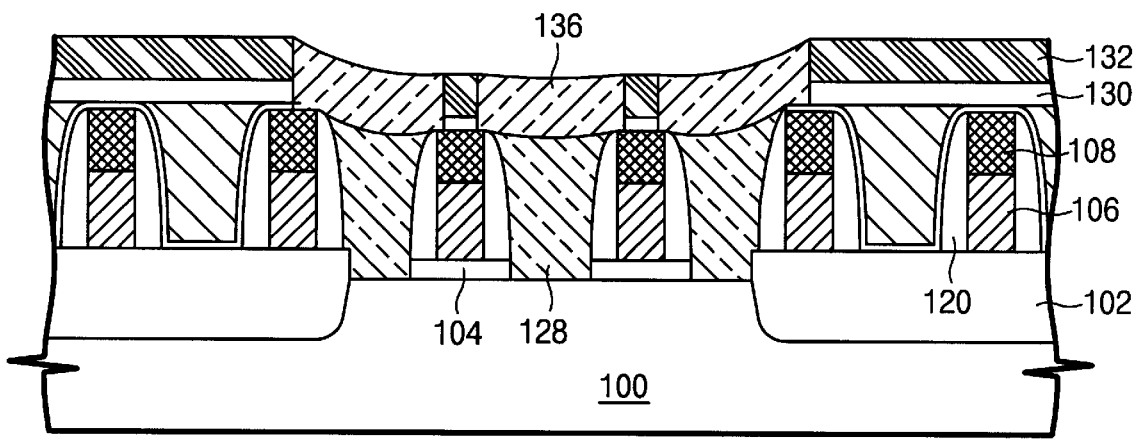

Successively, if a third conductive layer is formed on the overall surface of the semiconductor substrate and the third conductive layer is etched until a surface of the seventh insulating layer 132 is exposed (that is, the third conductive layer is left only in a contact hole), a second pad 136 is formed, as shown in FIG. 3G. The third conductive layer is made of a material selected from a group consisting of polysilicon, tungsten, a TiN. The first pad 128 and the second pad 136 according to a series of the aforesaid processes serve as a conductive pad connecting the bit line/storage electrode (not shown) to the semiconductor substrate 100.

Now turning to FIG. 4A to FIG. 4E which illustrate a process of forming a pad for bit line/storage electrode of the second embodiment of the present invention.

Figure 4A:
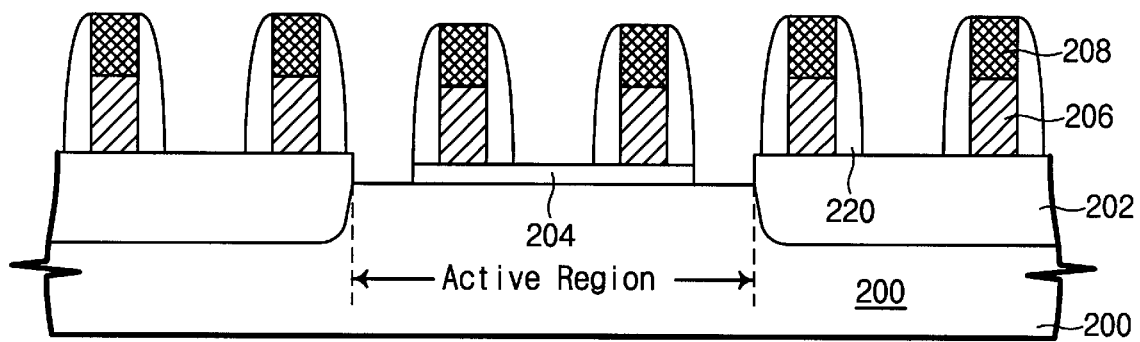
FIG. 4A to FIG. 4E are sectional views describing a method for forming a pad according to the Second Embodiment of the present invention.

Referring to FIG. 4A, an isolating insulator layer 202 is formed on a semiconductor substrate 200, wherein the isolating insulator layer 202 defines an active region where switching transistors are formed. Conventionally, a first insulating layer 204, a first conductive layer 206, and second insulating layer 208 are sequentially formed on the semiconductor substrate 200. The first insulating layer 204 serves afterwards as a gate oxide layer. The second insulating layer 208 is made of nitride having a thickness of about 1,000 to 2,000 Å. After performing a conventional photo-etching process to form a gate electrode, an ion implantation is performed to form a source/drain region of the switching transistors.

Figure 4B:
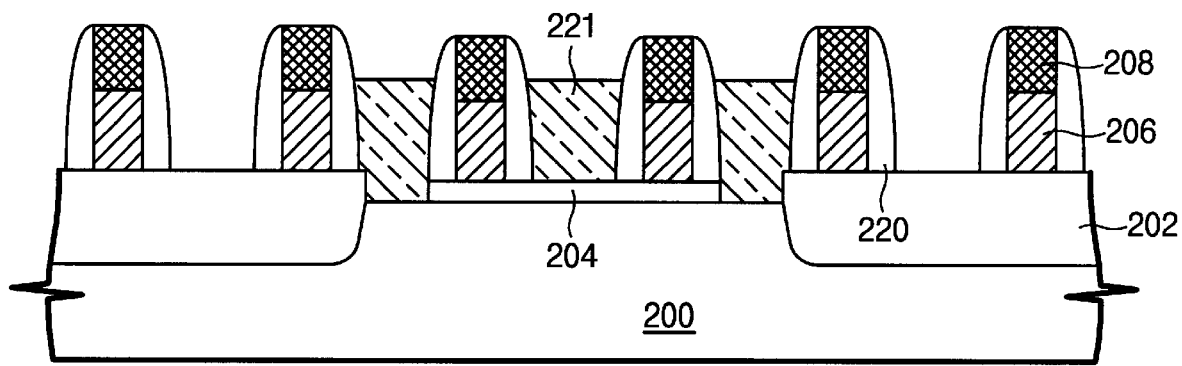
Figure 4C:
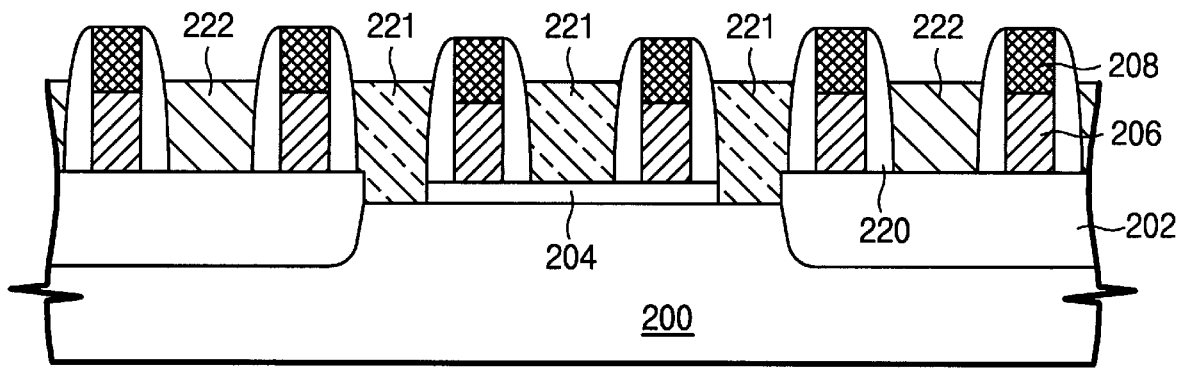

Next, a third insulating layer is formed having a thickness of about 500 to 1,000 Å on an overall surface of the semiconductor substrate 200. The third insulating layer is etched by the etch back process, so that gate spacers 220 are formed on sidewalls of the gate electrode 206, the second insulating layer 208, and the first insulating layer 204, as shown in FIG. 4A. If a narrow groove between gate electrodes is filled by using an epitaxial growth process, as shown in FIG. 4B, a first pad 221 is formed. Assuming that an active open spacing as a height of about 1,400 Å, filling a groove between gate electrodes is about 2,500 Å, and a spacing formed between pads is about 500 Å, the ratio of height direction growth speed to width direction growth speed is 4–6:1.

A fourth insulating layer 222 serving as an interlayer insulating film is formed, having a thickness of about 500 to 5,000 Å, on an overall surface of the semiconductor substrate 200. The fourth insulating layer 222 is etched until a surface of the first pad 221 is exposed by a process selected from a group consisting of an etch back process, a wet etch process, and a combination thereof.

Figure 4D:
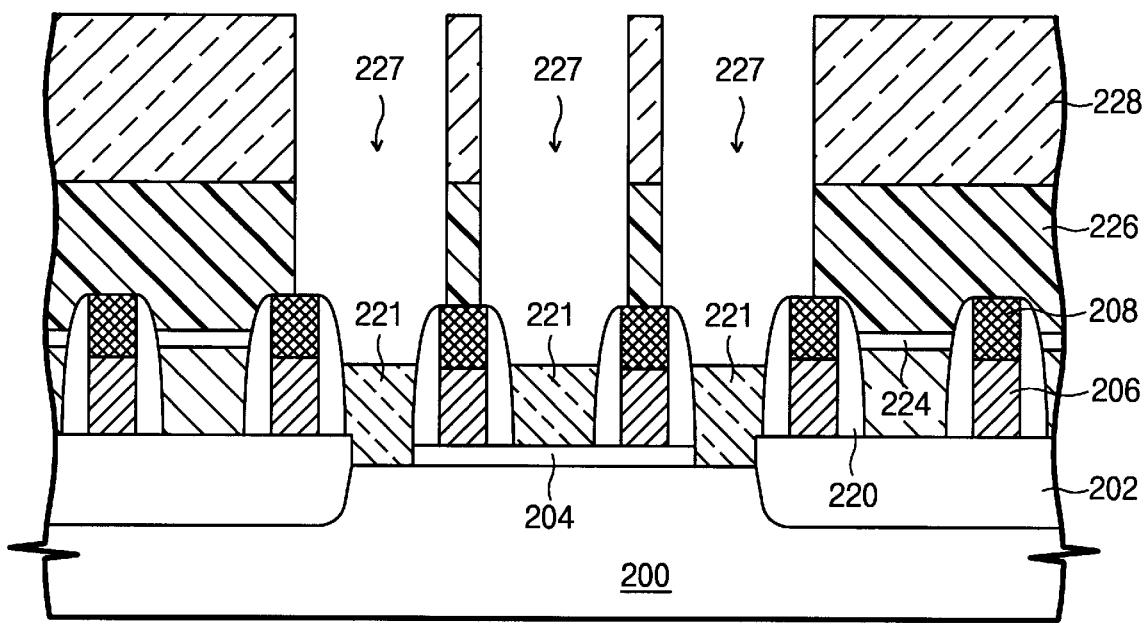

A fifth insulating layer 224 and a sixth insulating layer 226 are sequentially formed on a resultant (referring to FIG. 4C) of aforesaid process. A photoresist pattern 228 is formed to perform the CT-SAC process, as shown in FIG. 4D. That is, a photoresist is removed on a region where a contact is formed, but is left on a region where an interlayer insulating film is formed.

The fifth insulating layer 224 and the sixth insulating layer 226 are etched by using the photoresist pattern 228 as a mask until the surface of the first pad 221 is exposed, and this etching resultant is as shown in FIG. 4D. The fifth insulating layer 224 serves as an etch-stop layer during etching the sixth insulating layer 226. The fifth insulating layer 224 is made of nitride having a thickness of about 50 to about 200 Å and the sixth insulating layer 226 is made of oxide having a thickness of about 500 to 2,000 Å.

Figure 4E:
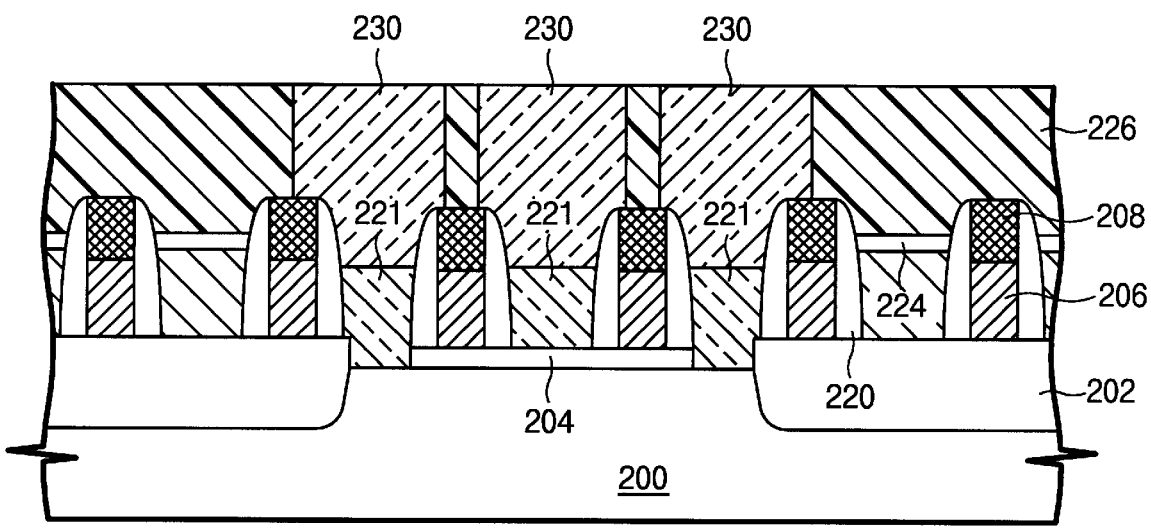

After removal of the photoresist pattern 228, a third conductive layer is formed to fill up a self-aligned contact hole 227. Thereafter, if the third conductive layer is etched until the sixth insulating layer 226 is exposed, as shown in FIG. 4E, a second pad 230 is formed. At this time, the first pad 221 and the second pad 230 serve as a pad for bit line/storage electrode.

Figure 5:
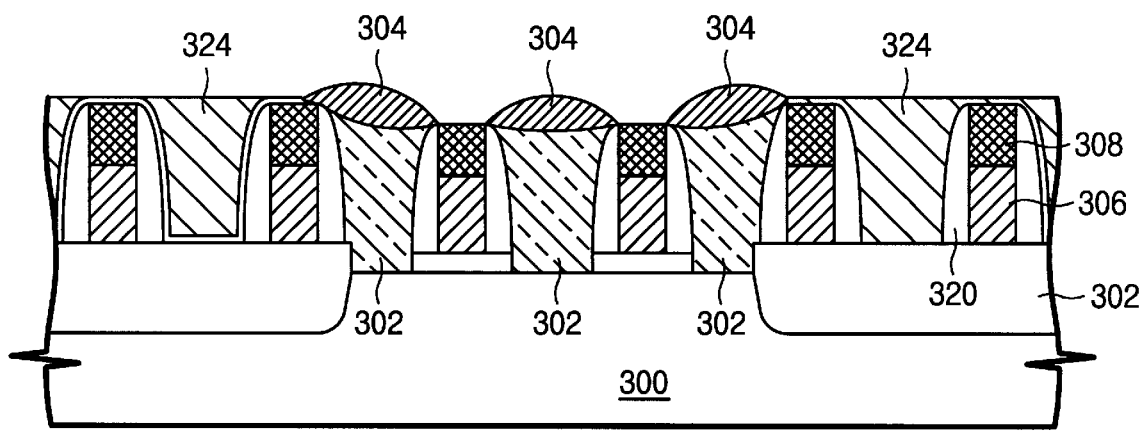
FIG. 5 is a sectional view showing a structure of a pad according to the Third Embodiment of the present invention.

FIG. 5 illustrates a structure of forming a pad for bit line/storage electrode according to the third embodiment of this invention.

In FIG. 5, a process of forming a first pad 302 is equally performed according to FIG. 3A to FIG. 3D of the first embodiment. It is, therefore, omitted to describe the process of forming the first pad 302. A second pad 304 is formed on the first pad 302 by using the epitaxial growth process, as shown in FIG. 5. Assuming that a spacing between gate electrodes is about 1,400 Å, a filling thickness is about 2,500 Å, and a spacing between pads is about 500 Å, the ratio of height direction growth speed to width direction growth speed is 4–6:1.

Figure 6:
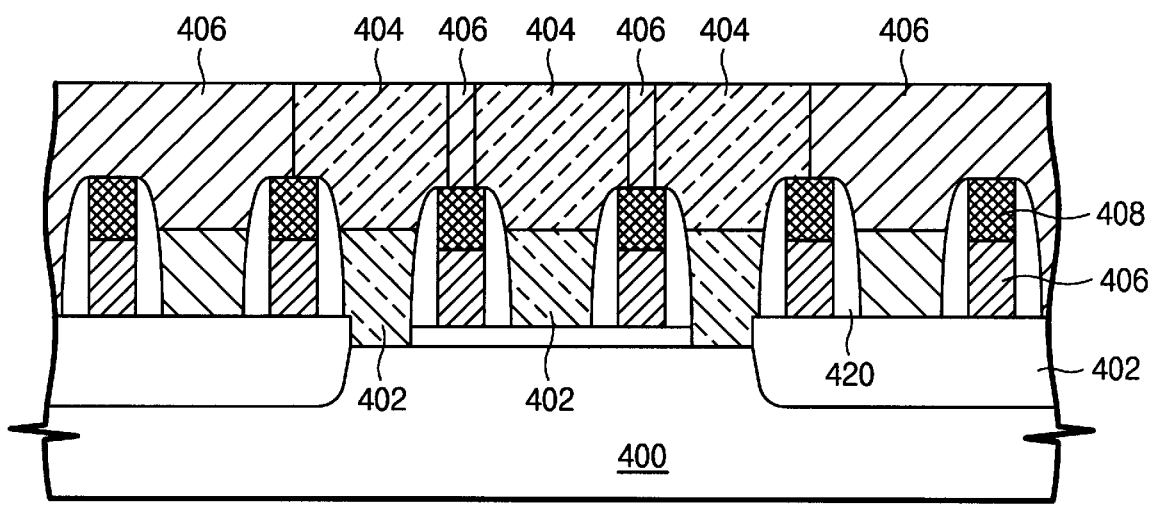
FIG. 6 is a sectional view showing a structure of a pad according to the Fourth Embodiment of the present invention.

FIG. 6 illustrates a structure of forming a pad for bit line/storage electrode according to the fourth embodiment of this invention.

In FIG. 6, a process of forming a first pad 402 is equally performed according to FIG. 4A to FIG. 4D of the second embodiment. It is, therefore, omitted to describe the process of forming the first pad 402. A second pad 404 is formed on the first pad 402 by using the epitaxial growth process. If a pad for bit line/storage electrode is formed under the same condition as the third embodiment, the pad will be grown according to aforesaid growth ratio (4–6:1). After formation of an interlayer layer, which serves as an interlayer insulating film, on an overall surface of a semiconductor substrate 400, the insulating layer 406 is etched until the second pad is exposed by a CMP process or an etch back process. This etching resultant is shown in FIG. 6.

The following is a summary of a method for forming a pad in accordance with the first embodiment to the fourth embodiment. First, a first pad is formed by the RAT-SAC (the first embodiment and the third embodiment) and a second pad is formed by the CT-SAC process (the first embodiment) or the epitaxial growth process (the third embodiment). Further, a first pad is formed by the epitaxial growth process (the second embodiment and the fourth embodiment) and a second pad is formed by the CT-SAC process (the second embodiment) or the epitaxial growth process (the fourth embodiment). It is apparent to those skilled in the art that there may be various combination methods that a pad for bit line/storage electrode is formed, at least in twice, by combining the RAT-SAC, the CT-SAC, and the epitaxial growth processes. It is also apparent to those skilled in the art that a conductive pad formation method according to the present invention may be applied to not only a conductive pad for bit line/storage electrode but also other various wiring formation process.

As mentioned above, a conductive pad for bit line/storage electrode is formed of a first pad and a second pad, in twice, by combining self-aligned contact processes (for example, the RAT-SAC, the CT-SAC, and the epitaxial growth processes). Thus, it is prevented that a shoulder portion of a gate electrode is overetched to create an electrical short of pad to gate, a size of a pad is limited to a spacing between gate electrodes, a pad and a semiconductor substrate are not electrically connected to each other (not-open), and electrical connection is created by lack of margin between BCs, in case of using only one process selected from a group consisting of the RAT-SAC process, the CT-SAC process, and the epitaxial growth processes.

What is claimed is:

1. A method of fabricating a semiconductor device, comprising:

providing a semiconductor substrate having a plurality of wires formed therein, said plurality of wires being surrounded by a first insulating layer;

forming a first conductive layer covering said first insulating layer and said semiconductor substrate;

etching said first conductive layer to expose said first insulating layer and to remain only between said wires, thereby forming a first pad;

forming sequentially second and third insulating layers covering said first pad and said first insulating layer;

forming a photoresist pattern having at least one opening for exposing said first pad on said third insulating layer over a surface of said wires, said opening being wider than an upper width of said first pad;

etching sequentially said third and said second insulating layers by using said photoresist pattern as a mask until said first pad is exposed;

forming a second conductive layer covering said first pad and said third insulating layer after removal of said photoresist patterns; and etching said second conductive layer until said second insulating layer is exposed, thereby forming second pad, said second pad being in contact with said first pad and being wider than said first pad.

2. The method according to claim 1, wherein said first and said second pads serve as a pad for bit line/storage electrode of DRAM (dynamic random access memory).

3. The method according to claim 1, wherein said first conductive layer is made of polysilicon having a thickness of about 3,000 to 7,000 Å, said polysilicon being doped with the same impurity as source/drain of an integrated circuit comprising a DRAM cell.

4. The method according to claim 1, wherein said second insulating layer is made of nitride having a thickness of about 50 to 200 Å.

5. The method according to claim 1, wherein said third insulating layer is made of oxide having a thickness of about 500 to 2,000 Å.

6. The method according to claim 1, wherein said second insulating layer serves as an etch-stop layer during etching of said third insulating layer.

7. The method according to claim 1, wherein said first pad is formed by etching said first conductive layer by using a CMP (chemical mechanical polishing) process, or an etch back process, or both thereof.

8. The method according to claim 1, wherein said second conductive layer is made of a material selected from a group consisting of silicon, tungsten, and TiN.

9. The method according to claim 1, wherein said second pad is formed by etching said second conductive layer by using a CMP process, or an etch back process, or both thereof.

10. A method of fabricating a semiconductor device, comprising:

providing a semiconductor substrate having a plurality of wires formed therein, said plurality of wires being surrounded by a first insulating layer;

forming a first conductive pad between said wires by using a selective epitaxial growth process;

forming a second insulating layer on an overall surface of said semiconductor substrate;

etching said second insulating layer until said first conductive pad is exposed;

forming sequentially third and fourth insulating layers on said overall surface of said semiconductor substrate;

forming a photoresist pattern having at least one opening for exposing said first conductive pad on said fourth insulating layer over a surface of said wires, said opening being wider than an upper width of said first conductive pad;

etching sequentially said fourth and said third insulating layers by using said photoresist pattern as a mask until said first conductive pad is exposed;

removing said photoresist pattern;

forming a conductive layer covering said first conductive pad and said fourth insulating layer; and etching said conductive layer until said fourth insulating layer is exposed, thereby forming a second conductive pad, said second conductive pad being in contact with said first conductive pad and being wider than said first conductive pad.

11. The method according to claim 10, wherein said first insulating layer surrounding said respective wires is formed to include a gate spacer and a gate capping layer.

12. The method according to claim 10, wherein said first and said second conductive pads serve as a conductive pad connecting bit line/storage electrode to said semiconductor substrate when said semiconductor device is a DRAM (dynamic random access memory) device.

13. The method according to claim 10, wherein said second insulating layer, as an interlayer insulating film, is made of an oxide having a thickness of about 500 to 5,000 Å.

14. The method according to claim 10, wherein said third insulating layer is made of nitride having a thickness of about 50 to 200 Å and said fourth insulating layer is made of an oxide having a thickness of about 500 to 2,000 Å.

15. The method according to claim 14, wherein said third insulating layer serves as an etch-stop layer during etching of said fourth insulating layer.

16. A method of fabricating a semiconductor device, comprising:

providing a semiconductor substrate having a plurality of wires are formed therein, said plurality of wires being surrounded by an insulating layer;

forming a conductive layer covering said insulating layer and said semiconductor substrate;

etching said conductive layer to expose said insulating layer and to remain only between said wires, thereby forming a first pad; and forming a second pad on said first pad by using an epitaxial growth process, so that a surface of said wires is not covered, said second pad being wider than said first pad.

17. The method according to claim 16, wherein said first and said second pads serve as a conductive pad connecting bit line/storage electrode to said semiconductor substrate when said semiconductor device is a DRAM (dynamic random access memory) device.

* * * * *